United States Patent [19]

Seelbach et al.

[11] Patent Number: 4,699,805
[45] Date of Patent: Oct. 13, 1987

[54] PROCESS AND APPARATUS FOR THE LOW PRESSURE CHEMICAL VAPOR DEPOSITION OF THIN FILMS

[75] Inventors: Christian A. Seelbach, Scottsdale; William M. Ingle, Phoenix; Carl A. Goetz, Scottsdale, all of Ariz.

[73] Assignee: Motorola Inc., Schaumburg, Ill.

[21] Appl. No.: 881,988

[22] Filed: Jul. 3, 1986

[51] Int. Cl.$^4$ .............................................. B05D 5/12
[52] U.S. Cl. ................................... 437/245; 118/715; 118/733
[58] Field of Search ................... 427/91; 118/733, 715

[56] References Cited

U.S. PATENT DOCUMENTS 4,392,299  7/1983  Shaw ........................................ 427/9
4,619,840 10/1986  Goldman ............................... 427/91

OTHER PUBLICATIONS

C. E. Morosanu and V. Soltuz, "Thin Film Preparation by Plasma and Low Pressure CVD in a Horizontal Reactor", Vacuum, vol. 31, No. 7, pp. 309-313, 1981.
M. J. Cooke, "A Review of LPCVD Metallization for Semiconductor Devices", Vacuum, vol. 35, No. 2, pp. 67-73, 1985.

Primary Examiner—John D. Smith
Assistant Examiner—Vi D. Dang
Attorney, Agent, or Firm—John Fisher; Raymond J. Warren

[57] ABSTRACT

A process and apparatus for LPCVD of thin metallic films is disclosed. The apparatus includes a U-shaped injection tube through which high molecular weight reactants are injected into a reaction chamber. The input and output ends of the U-shaped tube are coupled to a removeable feedthrough plate which, in turn, is coupled to the end cap which seals one end of the reaction chamber. A deposition surface is placed in the chamber through a second end cap at the opposite end of the chamber. The output end of the U-shaped injection tube is coupled to a vacuum pump and the high molecular weight reactant is drawn through the injection tube and dispersed in the reaction chamber through a plurality of holes in the input side of the injection tube.

25 Claims, 6 Drawing Figures

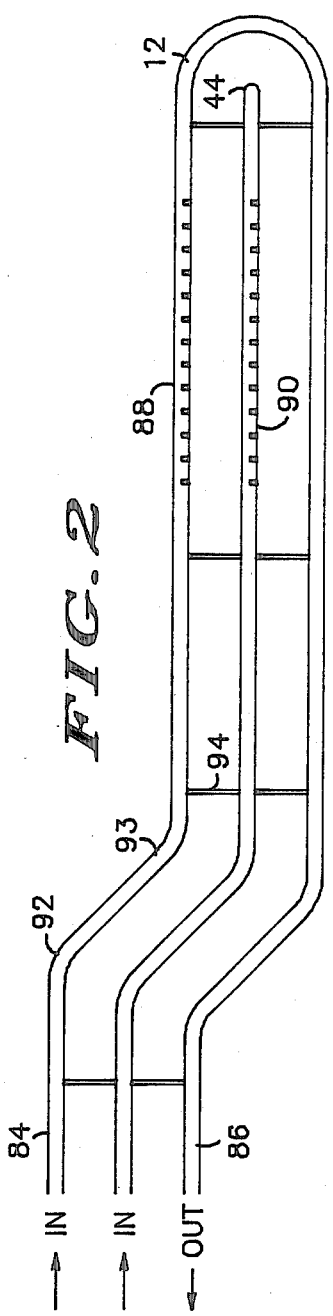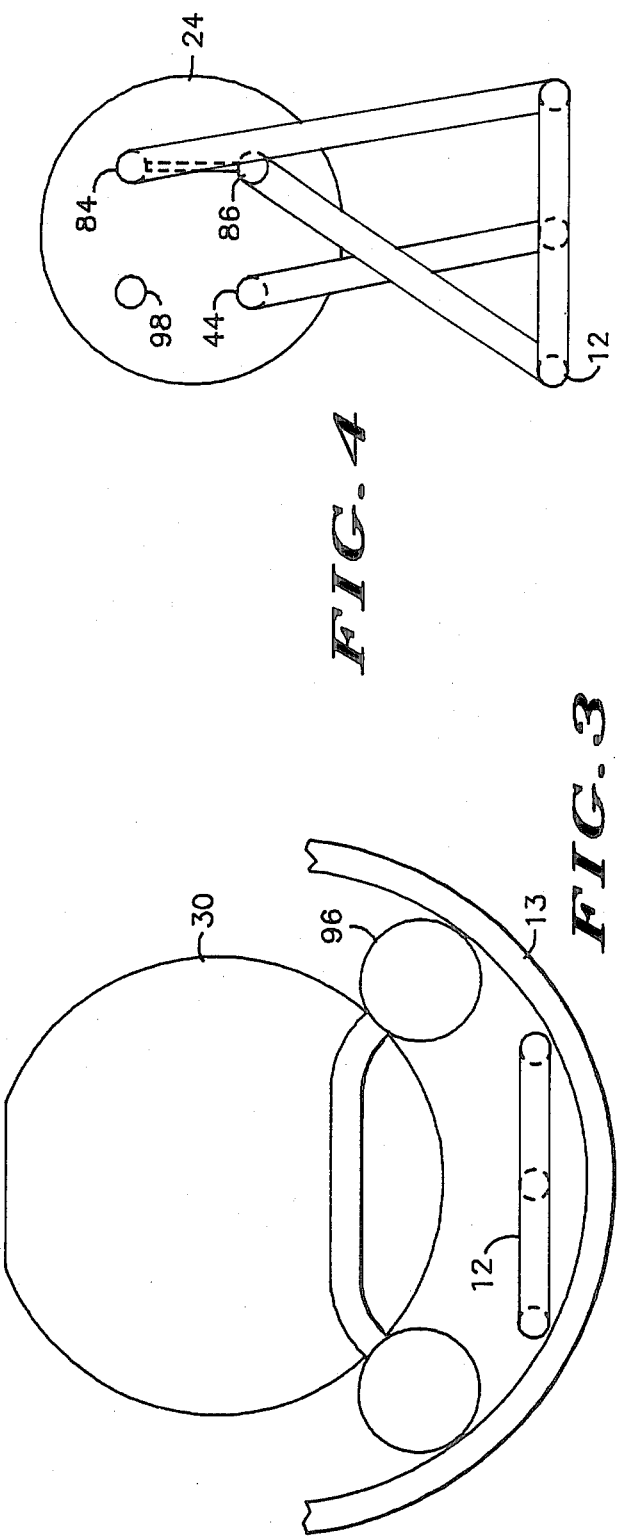

PROCESS AND APPARATUS FOR THE LOW PRESSURE CHEMICAL VAPOR DEPOSITION OF THIN FILMS

BACKGROUND OF THE INVENTION

This invention relates generally to a process and apparatus for the low pressure chemical vapor deposition of thin films, and more specifically to process and apparatus for the deposition of metallic films.

Low pressure chemical vapor deposition (LPCVD) is utilized for the formation of various thin films. Several of these films are essential in the fabrication of semiconductor devices including polycrystalline silicon, silicon oxide, and silicon nitride. More recently, interest has been generated in the LPCVD of refractory metallic films such as selective tungsten, tungsten silicide, titanium silicide, titanium nitride, and titanium boride. As applied to the electronics industry, these refractory metallic films are useful as improved gate electrodes and interconnections on MOS devices, contact enhancements to semiconductor materials, metallization of Schottky devices, diffusion barriers, and the like. In other industries the refractory metallic films are utilized to form hard protective coatings for tools, dies, and other types of machinery benefiting from such refractory surfaces.

The source gases for these binary metallic compounds nominally consist of a semivolatile metal source material such as $WF_6$ or $TiCl_4$ and the volatile hydride or halide of an inorganic source material such as $SiH_4$, $NH_3$, $B_2H_6$, or $BCl_3$ and $H_2$. The deposition occurs through the metathetical reaction between the metal halide and inorganic hydride or halide to deposit a refractory metal film and liberate a hydrogen halide. For example, tungsten silicide and titanium boride are deposited in accordance with the following reactions. For the deposition of tungsten silicide $$WF_6 + 2SiH_4 \rightarrow WSi_2 + 6HF + H_2.$$

For the deposition of titanium boride, $$TiCl_4 + B_2H_6 \rightarrow TiB_2 + 4HCl + H_2.$$

The binary metallic films formed by chemical vapor deposition and specifically by low pressure chemical vapor deposition tend to be uniform and to have very low concentrations of unwanted impurities. The stoichiometric uniformity results from the fact that the elemental composition of CVD films is strongly influenced by free energies of formation of compounds for specific stoichiometric values. The low concentration of unwanted impurities results from the fact that, during deposition, impurities such as oxygen, carbon, and other trace metals are conducted away from the deposition surface by volatile reaction by-products diffusing away from this surface. In addition, films deposited by LPCVD tend to be conformal and to yield excellent step coverage.

The deposition of some materials such as polycrystalline silicon is relatively straight forward. As described, for example, in U.S. Pat. No. 3,900,597, polycrystalline silicon is deposited on semiconductor wafers by loading multiple wafer boats into a tubular quartz reactor, evacuating the reactor tube, heating the tube to the desired temperature, and injecting source gases to obtain a uniform deposit across each wafer and from wafer to wafer. The deposition of refractory metals and other materials which are deposited from high molecular weight source materials is not as simple, however, as the deposition of polycrystalline silicon. This simplistic approach is not adequate to obtain uniform film thickness from wafer to wafer. The major film uniformity problems arise as a result of two factors: (1) The generation of reaction byproducts down the boat; and (2) The retardation of the diffusion rate of the high molecular weight source material as compared to lower molecular weight materials.

The adverse effect which arises from the generation of reaction by-products down the boat is primarily due to the build up of the respective hydrogen halide (HF and HCl in the two reactions described above). As the hydrogen halide concentration increases, the rate of a competing side reaction is also enhanced. For example, as tungsten silicide is deposited by the reaction $$WF_6 + 2SiH_4 \rightarrow WSi_2 + 6HF + H_2$$

The tungsten silicide is being depleted by the reaction $$WSi_2 + 10HF \rightarrow WF_6 + 2H_2SiF_2 + 3H_2.$$

The build up of hydrogen halide and the resulting problem of nonuniformity is a generic problem which accompanies the deposition of metallic films which utilize metallic halide source materials.

At the reduced pressures used in low pressure chemical vapor depostition (generally less than about 65 Pa) the mean free path between molecular collisions approximates the geometries found in a typical LPCVD reactor. The diffusion rate of gases thus plays a primary role in their transport; and, therefore, the rate of their transport is approximately proportional to the inverse square root of their molecular masses. For example, at the reduced pressures of interest, $SiH_4$ diffuses about three times as fast as $WF_6$. Lighter by-product gases such as HF and $H_2$ diffuse at even higher rates. The result of this disparity in diffusion rates is a non-uniform distribution of reactants along the reaction chamber; the high molecular weight reactant builds up in concentration near the input end in contrast to locations further along the reaction chamber.

To compensate for the build up and for the generally nonuniform distribution of reactants, it is essential to increase the concentration of the high molecular weight metallic source material down the reaction chamber. In an attempt to provide a uniform distribution of reactants, the prior art discloses an injection tube or manifold with holes spaced to allow the injection of gases along the entire length of the injection tube. This modification, however, does not yield uniform metallic films because most of the high molecular weight gas is ejected from the first few holes in the injection tube and virtually none is ejected from holes further along the tube. This adverse phenomenon results from the diffusion of lighter molecular weight source gases and reaction by-products back into the injector tube holes. The concentration of the lower molecular weight source gases, in turn, retards the diffusion of the higher molecular weight metallic source gases down the injector tube.

To further attempt to provide a uniform distribution of reactants throughout the reaction chamber, attempts have been made to inject the high molecular weight metallic source gases into the center of the reactor and to exhaust by-products from both ends of the reactor. This technique enhances the uniformity of the deposition, but requires substantially increased reactor complexity and complicates the loading, unloading and general handling of the deposition surfaces.

In considering the problem of achieving uniformity of deposition in a low pressure chemical vapor deposition process, a further problem must also be given consideration. High quality LPCVD films require precise control of the reaction ambient. Any leak in the deposition system which allows even minute amounts of air or other contaminant into the reaction system results in inferior films and can even lead to potentially dangerous reactions between the air and certain of the reactants. Accordingly, the reaction apparatus must be constructed so that the deposition surfaces can be placed in the chamber and subsequently removed without compromising the integrity of the sealed system. In addition, it is preferable that most, if not all, of the plumbing for vacuum lines, reactant and reactant by-product lines, and the like be designed to ensure leak-free operation of the system. It is especially important, for example, that the seal between the reactor tube and the end caps which enclose the ends of the tube be undisturbed once the system is placed in operation. This includes leaving the seals undisturbed when the composition or type of film deposited in the reactor is changed.

Although some of the foregoing problems can be overcome by using a refractory metal LPCVD reactor which deposits films upon a single deposition surface, these single surface systems have the disadvantage of low throughput, high unit cost, and increased complexity. Accordingly, a need existed for an apparatus and process for depositing thin films which provide uniform and high integrity films with a high throughput.

It is therefore an object of this invention to provide an improved process for the low pressure chemical vapor deposition of uniform films.

It is another object of this invention to provide improved apparatus for low pressure chemical vapor deposition.

It is still another object of this invention to provide an improved injector for injecting high molecular weight reactants in a low pressure chemical vapor deposition system.

It is yet another object of this invention to provide an improved process for the low pressure chemical vapor deposition of metallic films from high molecular weight metallic compounds onto semiconductor wafers.

It is still another object of this invention to provide an improved end cap and removeable feedthrough for a chemical vapor deposition reactor system.

BRIEF SUMMARY OF THE INVENTION

The foregoing and other objects and advantages of the invention are achieved through a process and apparatus which, in one embodiment, utilizes a U-shaped injection tube for the uniform injection of a high molecular weight reactant into a reaction chamber. In accordance with that embodiment, a reaction chamber is provided which has first and second ends enclosed by first and second end caps, respectively. A generally U-shaped injection tube including input and output ends coupled through the first end cap is positioned within the reaction chamber. The injection tube includes a plurality of injection holes which are positioned centrally near the bottom of the reaction chamber. A deposition surface is inserted into the reaction chamber through the second end of the tube to position the surface generally proximate to and over the plurality of injection holes. The pressure in the reaction chamber is reduced to the desired reaction pressure and the deposition surface is heated to a predetermined reaction temperature. A source of at least one high molecular weight reactant compound is coupled to the input of the injection tube. The output of the injection tube is coupled to a vacuum pump and the high molecular weight reactant is pumped through the injection tube, dispersing a desired amount of the reactant through the plurality of injection holes into the reaction chamber. The reactant compound is reacted at the heated deposition surface to form the desired thin film. The remainder of the higher molecular weight reactant is exhausted from the output end of the injection tube. In addition, reaction by-products and unreacted source materials are exhausted from the reaction chamber into the vacuum pump. The deposition surface with the film thereon is allowed to cool before opening the chamber and exposing the film to the ambient.

BRIEF DESCRIPTION OF THE DRAWINGS

FIG. 2 illustrates an injector tube in accordance with the invention;

FIGS. 3 and 4 illustrate positioning of injector tubes relative to a deposition surface and a feedthrough plate, respectively.

DETAILED DESCRIPTION OF PREFERRED EMBODIMENTS

Figure 1:
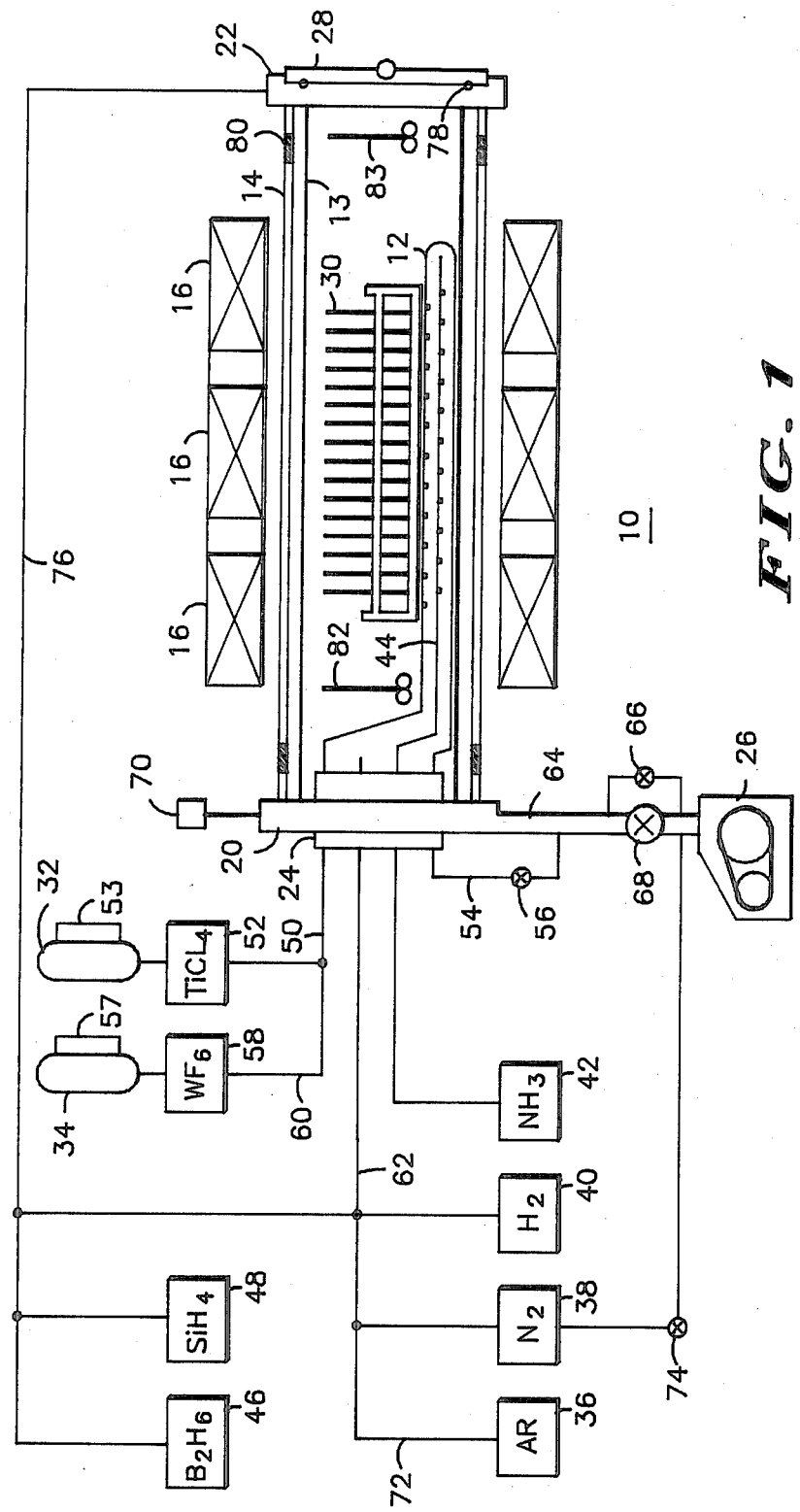
FIG. 1 schematically illustrates deposition apparatus in accordance with the invention.

FIG. 1 schematically illustrates apparatus 10, in accordance with the invention, for the low pressure chemical vapor deposition of thin films, and especially metallic films deposited from high molecular weight reactants. In this context, the term "metallic" is used to refer to compounds in which one or more of the constituents is a metal. The apparatus is especially useful when one or more of the reactants has a molecular weight greater than about 50, and especially for those reactants having a molecular weight greater than about 100. The molecular weight, of course, is measured in atomic mass units. The apparatus can however, be used with other lower molecular weight reactants, but there is less need for the invention with such lower molecular weight reactants. A key element in the invention is a generally U-shaped injection tube 12 which provides for the desired distribution of the high molecular weight reactants along the length of the reaction chamber. The U-shaped injection tube is described in more detail below.

Apparatus 10 can be, for example, a continuously operating furnace, constructed to provide extremely precise temperature, as is widely used in the semiconductor industry. LPCVD reactor 10 includes a tubular reaction chamber 14 which is preferably an elongate, cylindrically shaped quartz tube. Electric coils 16 wound around the outside of tube 14 provide the precise temperature control. The two ends of the elongate tube 14 are enclosed by end caps 20, 22. Attached to end cap 20 is a readily removable feedthrough plate assembly 24 with a plurality of connections for flexible tubes for passing thermally stable source gases in and out of tube 14 as explained more fully below. Also coupled to end cap 20 is a vacuum pump 26 which provides control of the pressure within the reaction chamber. End cap 22 is provided with a removable door 28 which seals to end cap 22 and which is used for introducing and removing deposition surfaces, here illustrated as a plurality of semiconductor wafers 30.

A number of reactant materials and process gases are coupled to the reaction chamber. High molecular weight materials such as $TiCl_4$ 32 and $WF_6$ 34 are coupled to the reaction chamber through the U-shaped injection tube 12. Low molecular weight gases such as argon 36, nitrogen 38, hydrogen 40, and ammonia 42 are coupled to the reaction chamber through a straight injection tube 44. Injection tube 44 is called "straight" in contrast to the U-shaped injection tube 12. As will be described later, injection tube 44 is not necessarily straight along its entire length. In addition, reactants such as $B_2H_6$ 46 and $SiH_4$ 48 which are not thermally stable are injected into the reaction chamber through end cap 22.

In more detail, a first flexible tube 50 couples the high molecular weight metallic source material 32 to the removable feedthrough plate 24 by a mass flow controller 52. A sight glass 53 aids in monitoring the amount of source material. The source material vapor flows through the feedthrough plate 24 into the U-shaped injector tube 12 from which the material is dispensed into the reaction chamber. A flexible external exhaust tube 54 exhausts the U-shaped injector tube through the removable feedthrough plate 24 and a throttle valve 56. An alternate high molecular weight source material 34 with sight glass 57 is coupled through a mass flow controller 58 and tubing 60 to the first flexible tube 50. Thus either one of the source materials 32 or 34 can be selected depending upon the thin film material being deposited. In a preferred embodiment these source materials as well as tubing 50, 60 are heated slightly to increase the vapor pressure for higher flow rates through the respective mass flow controllers. The heating of the metallic source materials and connectors is accomplished by wrapping the container and connectors with a resistance heating tape or coil and by passing a current sufficient to increase the temperature a predetermined amount. For example, both the $TiCl_4$ and $WF_6$ source materials are preferably heated to about 40-45 degrees Celsius.

The lower molecular weight, thermally stable source materials and or carrier gases 36, 38, 40, 42 are introduced to the reaction chamber through connector 62 which couples to the straight injector tube through the removable feedthrough plate. Mass flow controllers (not shown) are used to control these materials and or gases. The straight injector tube can be used with these materials because back diffusion of lower molecular weight gases into the low molecular weight source and carrier gases is not a problem.

Vacuum pump 26 is coupled to end cap 20 through an exhaust conduit 64 and through pneumatic vacuum control valves 66 and 68. Pneumatic control valves 66 and 68 are regulated by a vacuum gauge 70 attached to end cap 20 which regulates the effective pumping speed of vacuum pump 26. Above about 6.6 KPa the system is "soft pumped" through pneumatic valve 66 below about 6.6 KPa the system is "hard pumped" through valve 68. If the refractory metallic film being deposited requires or generates appreciable quantities of hydrogen gas during deposition, the addition of a roots blower (not shown) between the vacuum pump and control valves may be required. An alternate procedure is to add an inert gas purge 72 to the deposition chamber which enhances the pumping speed of pump 26 with respect to hydrogen and circumvents the necessity for a roots blower. In the absense of hydrogen, the pressure within the deposition chamber is controlled (increased) by ballasting the vacuum pump with an inert gas through line 74. The vacuum pump thus maintains the desired reduced pressure in the chamber and, through proper control of pneumatic valves 66 and 68, hard and soft pumping are achieved.

The flow of reactants within the reaction chamber is generally from right to left in the illustration because of the pumping through exhaust 64. Reactants such as $B_2H_6$ and $SiH_4$ which are not thermally stable must be injected on the upstream side of the system so that they are not heated until they move through the reaction zone. Accordingly, such thermally unstable reactants are conveyed through a tube 76 to end cap 22 and are there injected into the reaction chamber.

The removable door 28 seals against O-rings 78 to end cap 22 when the tube is evacuated. The removable door, in a preferred embodiment, automatically opens, gravity assisted, when the tube is returned to ambient pressure. Using end cap 20 for admitting the high molecular weight and other thermally stable source and carrier gases as well as for the evacuation of the reaction chamber greatly simplifies the loading of deposition surfaces through removable door 28 and end cap 22. None of the plumbing associated with end cap 20 is disturbed by the loading and unloading through door 28.

In further preferred embodiments of the invention, quartz tube 14 includes opaque rings 80 near each end. The opaque quartz rings block the light pipe effect of the clear quartz tube as described in U.S. Pat. Nos. 4,411,619 and 4,480,987. Further, quartz baffles 82 and 83 are positioned just outside furnace elements 16 and reflect heat back toward the center of the furnace and serve as heat shields for removable feedthrough plate 24 and removable door 28. The baffles and opaque quartz rings allow operation of the furnace at elevated temperatures without degradation of the O-ring seals on each end cap. For deposition temperatures greater than about 900° C. or for long deposition runs at temperatures above about 800° C. water cooling of the end caps may be necessary.

FIG. 1 illustrates a further preferred feature of the invention. A quartz liner 13 is placed within and concentric to reaction chamber 14. The liner prevents disposition on the walls of the reaction chamber and increases the useful life of the chamber. More importantly, the liner can be changed when switching from one deposition chemistry to another to prevent contamination of one deposition process by the residue of a previous deposition. The opening in removeable door 28 is large enough so that the liner can be removed and changed without disturbing end cap 22.

FIG. 2 schematically illustrates in greater detail the U-shaped injector tube 12 for use with high molecular weight source gases together with a straight injector tube 44. High molecular weight gases are coupled through the removable feedthrough plate to the input end 84 of the U-shaped injector tube. The output end 86 of the injector tube is coupled, through the removable feedthrough plate, to the vacuum pump. The high molecular weight source gases are pumped through the U-shaped tube and are injected into the reaction chamber through a plurality of holes 88 along the input side of the injector tube. The hole size and spacing is selected for the proper injection of different source gases. Lower molecular weight source material gases and carrier gases are injected through straight injector tube 44 which is also coupled through the removable feedthrough plate. The straight injector is provided with a plurality of holes 90 for the injection of gases. The plurality of holes, in each injector, are located so that when the injectors are properly positioned the injectors will cause the injection of the reactant gases in a direction toward the deposition surface into the heated portion of the reaction chamber proximate the deposition surface. As illustrated in the figure, in a preferred embodiment, the injector tubes are shaped with bends 92 and 93 so that the tubes, after coupling to the feedthrough plate, run along the bottom of the reaction chamber or liner below the deposition surfaces. Quartz spacers 94 stabilize the injector tubes and maintain the correct spacing between the two injectors.

FIG. 3 illustrates the relationship of the injectors 12, 44 relative to the position of deposition surface 30. The deposition surface 30 is here illustrated as a semiconductor wafer being held in a quartz boat 96. The rails of the quartz boat rest on the quartz reaction tube 14 or liner 13. The injection tubes are positioned below the silicon wafer 30 and do not interfere with the insertion of the boat. The gases are thus injected from underneath the deposition surfaces and in close proximity to those surfaces. The injectors could, of course, be positioned elsewhere and not interfere with the insertion of the deposition surfaces, but positioning as shown has proved to be particularly advantageous.

FIG. 4 illustrates the coupling of injectors 12 and 44 to the removable feedthrough plate 24. In addition to inputs to injectors 12 and 44 and the output from injector 12, feedthrough plate 24 also includes an additional input 98 through which a source or carrier gas which does not require an injector can be coupled. The design of each of these three injectors matches the requirements and limitations of the gas being injected. The reactor can further include two or more U-shaped tubes for the injection of two or more high molecular weight source gases and can further include more than one straight injector tube.

Figure 5:
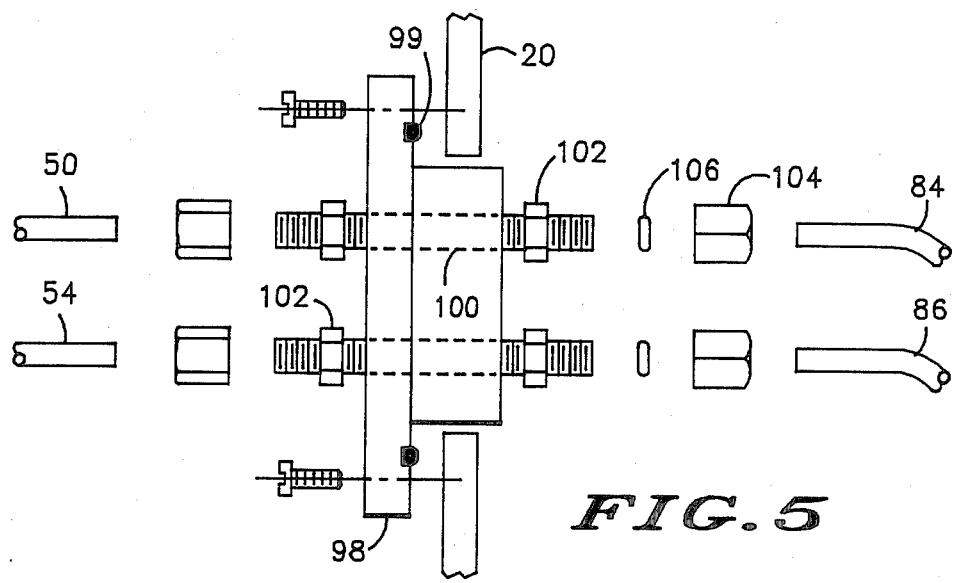
FIGS. 5 and 6 illustrate, in cross-section and perspective views, respectively, an end plate and feedthrough in accordance with a preferred embodiment of the invention.
Figure 6:
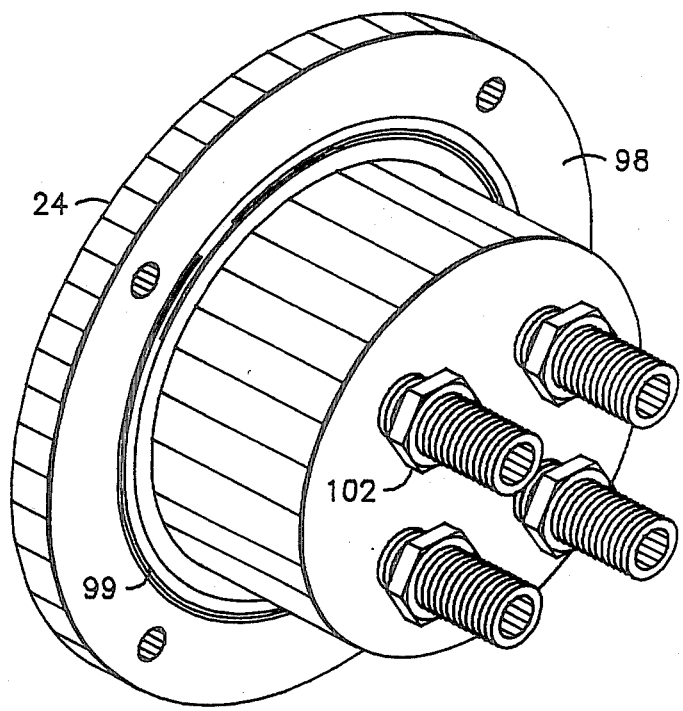

FIGS. 5 and 6 illustrate in cross-section and perspective views, respectively, a removable feedthrough plate 24 in accordance with the invention. The feedthrough plate, which can be fabricated from aluminum, stainless steel, or like material, includes a flange 98 which is securely bolted to end cap 20. O-ring 99 provides a seal between the feedthrough plate and the end cap. The end cap itself is sealed to the end of the reaction tube. The seal to the end of the reaction tube is difficult to make and, accordingly, if possible, that seal is never broken. Instead, all changes to the reactor plumbing are made by removing the feedthrough plate and not by disturbing the end cap.

Holes 100 are drilled and tapped through the feedthrough plate to accommodate appropriate couplings 102. Flexible tube such as 50 and 54 connect to the exterior couplings with a compression fitting. Preferably the outside couplings and flexible tubes are fabricated from stainless steel or other materials suitable for the handling of corrosive materials.

In operation, the feedthrough plate is unfastened and withdrawn from end cap 20. The U-shaped and other injectors are positioned within the reaction chamber so that ends 84,86 and the end of injector 44 protrudes out the hole in the end cap. Connections are made to the ends of the injectors using compression nuts 104 and O-rings 106. The assembly of feedthrough plate and injectors is then positioned with the feedthrough plate seated against the end cap and the two bolted together. The injectors can be changed, cleaned, or replaced without disturbing the critical seal between the end cap and the reaction tube. None of the fittings are disturbed by the loading or unloading of deposition surfaces into the reaction chamber since those operations are carried out through the opposite end of the tube.

It has been found that the deposition of each refractory metallic film requires specific flow rates, temperatures, pressures, and residence times for optimum deposition rates and uniformity. The following nonlimiting examples serve to further illustrate practice of the invention and to demonstrate the optimization of some of these process variables.

EXAMPLE 1

A 170 mm inside diameter, standard, continuously heated diffusion furnace was prepared for the low pressure chemical vapor deposition of a 260 nm thick film of $TiB_2$ onto 75 mm and 100 mm silicon wafers during the processing of those wafers in the fabrication of semiconductor discrete devices and integrated circuits. A 116 mm outside diameter quartz tube having a length of 2 meters and equipped with opaque quartz rings about 160 mm from each end of the tube was positioned in the furnace and was fitted with O-ring sealed aluminum end caps at each end. A quartz sleeve having an outside diameter of 150 mm and having a length of 1.6 meters was centered in the 160 mm tube as a protective liner. The end cap at the exhaust end of the tube was provided with a removable feedthrough plate having standard compression fittings facing out and O-ring sealed fittings facing into the furnace. A source of $TiCl_4$ was coupled to the feedthrough plate with $\frac{1}{4}$ inch inside diameter stainless steel tubing. The $TiCl_4$ source was coupled through the feedthrough plate to a U-shaped injector as described above. The injector was fabricated from 9 mm quartz tubing with 12 injector holes spaced 1 inch apart and having a diameter of 0.050 inches. These holes were drilled through one wall of the inlet arm of the U-shaped injector tube. The output end of the U-shaped injector tube was coupled through the feedthrough plate and flexible stainless steel lines to a vacuum pump. The vacuum train used a 50 mm exhaust line to connect the reactor to the pump with a 5 mm valve for soft pumping in parallel with a 55 mm valve for hard pumping. The vacuum pump was a standard mechanical vacuum pump.

Two liters of 99.999 percent $TiCl_4$ was charged to a three liter stainless steel source vessel heated to 45 ±3° C. The source was connected to the removable feedthrough plate through a mass flow controler. $B_2H_6$ (5% in $H_2$) and argon source gases were connected to the front of the reactor and were injected through the metal end cap. Argon was added to enhance the pumping speed of the vacuum pump in the presence of the hydrogen. A throttle valve, located in the exhaust line, was adjusted to allow about 50 percent of the $TiCl_4$ to pass out the exhaust. The pressure within the reactor, under dynamic conditions, was set at about 80 Pa. Two deposition runs were made at two different temperatures.

The results of those depositions are summarized in the table below.

TABLE IA

Summary of Parameters For TiB$_2$ Deposition

| Temp. (°C.) | Time (Min) | Flow Rates (SCCM) | | | Deposition Rate (nm/min) |
|---|---|---|---|---|---|
| | | TiCl$_4$ | B$_2$H$_6$/H$_2$ | Ar | |
| Run 1. 650 | 30 | 45 | 25/475 | 100 | 10.0 |
| Run 2. 600 | 30 | 45 | 25/475 | 100 | 8.70 |

TABLE IB

Physical Properties of TiB$_2$ Film Deposited at 600° C.

| Film Thickness | 260 nm |
|---|---|
| Morphological Appearance | Silver Mirror |
| Boron To Titanium Ratio | 2.0 To 1 |
| Sheet Resistivity | 6.4 Ohms Per Square |
| Film Uniformity (X-Wafer) | ±2.0% |
| Film Uniformity (X-Boat) | ±7.0% |

EXAMPLE 2

The LPCVD reactor described in Example 1 was modified for the deposition of a 50 nm film of TiN. An NH$_3$ source was connected to the removable feedthrough plate through a mass flow controller and flexible stainless steel connector. Internal to the reaction chamber, an NH$_3$ conection was made to a single straight tube injector which contained twelve holes, spaced one inch apart, and each having a diameter of 0.050 inches. A hydrogen source was connected to the front (upstream) end cap of the reactor. Semiconductor wafers were loaded into the reactor and the reactor was evacuated as before and brought to the reaction temperature. The pressure during deposition was about 27 Pa. A TiN film deposition occured as summarized in the following tables.

TABLE IIA

Summary of Parameters for TiN Deposition

| Temp. (°C.) | Time (min) | Flow Rates (SCCM) | | | Deposition Rate (m/min) | Anneal Temp (°C.) |
|---|---|---|---|---|---|---|
| | | TiCl$_4$ | NH$_3$ | H$_2$ | | |
| Run 1. 700 | 30 | 45 | 100 | 100 | 1.67 | 900 |
| Run 2. 800 | 30 | 45 | 100 | 100 | 1.83 | 900 |

TABLE IIB

Physical Properties of TiN Film Deposited at 700° C.

| Film Thickness | 50.0 nm |
|---|---|
| Morphological Appearance | Yellow Gold |
| Nitrogen To Titanium Ratio | 1 To 1 |
| Sheet Resistivity | 17 Ohms Per Square |
| Sheet Resistance | 85 Micro Ohm Centimeter |
| Film Uniformity (X-Wafer) | ±3.8% |
| Film Uniformity (X-Boat) | ±8.6% |

EXAMPLE 3

WSi$_2$ films having a thickness of 400 nm were prepared in the same reactor by replacing the TiCl$_4$ source with WF$_6$ and the B$_2$H$_6$ source with SiH$_4$. In addition, the quartz liner and U-shaped injector were replaced to minimize cross-contamination of the WSi$_2$ films. Films of WSi$_2$ were deposited on semiconductor wafers which were loaded into the upstream end of the reaction chamber. The chamber was evacuated and brought to deposition temperature as above. Results of the deposition are summarized in the table below.

TABLE IIIA

Summary Of Parameters For WSi$_2$ Deposition

| Temp. (°C.) | Time (min) | Flow Rates (SCCM) | | Deposition Rate (nm/min) | Anneal Temp (°C.) |
|---|---|---|---|---|---|
| | | WF$_6$ | SH$_4$ | | |
| Run 1. 450 | 10 | 25 | 200 | 31 | 650 |
| Run 2. 450 | 10 | 15 | 200 | 20 | 650 |

TABLE IIIB

Physical Properties of WSi$_2$ Films Deposited at 450° C.

| Film Thickness | 310 nm |
|---|---|
| Morphological Appearance | Metallic Silver Grey |
| Silicon to Tungsten Ratio | 2.3 To 1 |
| Sheet Resistivity | 1.48 Ohms Per Square |
| Sheet Resistance | 46 Micro Ohm Centimeter |
| Film Uniformity (X-Wafer) | ±4.3% |
| Film Uniformity (X-Boat) | ±9% |

Thus it is apparent that there has been provided, in accordance with the invention, an improved apparatus and method for the deposition of thin films which meet the objects and advantages set forth above. Although the invention has been described and illustrated by reference to specific embodiments thereof, it is not intended that the invention be limited to these illustrative embodiments. Those skilled in the art will recognize, after a review of the foregoing detailed description, that variations and modifications are possible without departing from the spirit of the invention. For example, the same apparatus can be modified for use with other source gases. Further, the thin films and especially metallic thin films can be deposited on deposition surfaces other than semiconductor wafers. In addition, the LPCVD apparatus can be modified to include plasma generating electrodes. The LPCVD process then can be plasma enhanced. It is therefore intended that all such variations and modifications be included within the scope of the invention as defined by the appended claims.

We claim:

1. A process for the low pressure chemical vapor deposition of a metallic film which comprises the steps of: providing a tubular reaction chamber having first and second ends; providing first and second end caps for sealing said first and second ends, respectively; sealing said first and second end caps to said first and second ends; providing a U-shaped injector tube having input and exhaust ends coupled to and allowing passage of reactants through said first end cap, into said reaction chamber, and out said first end cap, said injector tube including a plurality of injection holes positioned within said reaction chamber; inserting a deposition surface into said reaction chamber; coupling said reaction chamber to a vacuum pump through said first end cap and reducing the pressure in said reaction chamber; heating said deposition surface to an elevated temperature; coupling said input end of said injector tube to a source of a high molecular weight metallic reactant compound; coupling said exhaust end of said injector tube to a vacuum pump and pumping said metallic reactant compound through said injector tube to cause injection of said metallic compound reactant through said plurality of injection holes; controlling the amount of said metallic reactant compound exhausted through said exhaust end; injecting a second reactant into said reaction chamber; and reacting said metallic reactant compound and said second reactant to deposit a metallic film on said deposition surface.

2. The process of claim 1 wherein said metallic reactant compound comprises a metallic halide.

3. The process of claim 1 further comprising the steps of: providing a feedthrough plate coupled to said first end cap; and coupling said U-shaped injector tube to said feedthrough plate.

4. The process of claim 3 further including the step of shaping said U-shaped injector tube to couple to said feedthrough plate and position said plurality of injection holes along the bottom of said reaction chamber parallel to an axis along said tubular reaction chamber.

5. The process of claim 1 wherein the step of controlling the amount comprises placing a throttle valve in series with said exhaust end and adjusting said throttle valve.

6. The process of claim 1 wherein said step of injecting a second reactant comprises coupling said second reactant through said first end cap.

7. The process of claim 6 wherein said second reactant is coupled to a second injector tube.

8. The process of claim 1 wherein said step of injecting a second reactant comprises coupling said second reactant through said second end cap.

9. The process of claim 1 wherein said deposition surface is inserted into said reaction chamber through said second end.

10. The process of claim 1 further comprising the step of inserting a liner into said reaction chamber concentric with said tubular reaction chamber.

11. A reaction apparatus for the low pressure chemical vapor deposition of thin films which comprises: a tubular reaction chamber having first and second ends; a first end cap sealed to said first end and having means for inserting a deposition surface therethrough and for enclosing said first end; a second end cap sealed to said second end and having a feedthrough plate removably joined thereto for enclosing said second end; a U-shaped injector tube positioned within said chamber including input and output ends coupled through said feedthrough plate and a plurality of injection holes located in said chamber; means for coupling said input end to a reactant source; means for coupling said output end to a vacuum pump; means for reducing the pressure in said chamber; and means for heating a deposition substrate positioned in said chamber.

12. The apparatus of claim 11 wherein said U-shaped injector tube is coupled to said feedthrough plate and is curved to position said plurality of holes near the bottom of said chamber and substantially parallel to the axis thereof.

13. The apparatus of claim 10 further comprising a second injector tube coupled through said feedthrough plate to a second reactant source.

14. The apparatus of claim 12 further comprising a second injector tube coupled through said feedthrough plate to a second reactant source and having a portion substantially parallel to a portion of said U-shaped injector tube.

15. The apparatus of claim 11 further comprising means to inject a second reactant into said chamber through said first end.

16. The apparatus of claim 11 wherein said feedthrough plate is sealed to said second end cap.

17. The apparatus of claim 11 further comprising a throttle valve coupled in series between said output end and said vacuum pump.

18. The apparatus of claim 11 further comprising a tubular sleeve inserted in said chamber and concentric therewith.

19. The apparatus of claim 11 further comprising means for generating a reactant plasma in said chamber.

20. A process for the low pressure chemical vapor deposition of a film which comprises the steps of: providing a tubular reaction chamber having first and second ends; providing first and second end caps for sealing said first and second ends, respectively; providing a U-shaped injector tube having input and exhaust ends coupled to and allowing passage of reactants through said first end cap, into said reaction chamber, and out said first end cap, said injector tube including a plurality of injection holes positioned within said reaction chamber, and out said first end cap, said injector tube including a plurality of injection holes positioned within said reaction chamber; inserting a deposition surface into said reaction chamber; reducing the pressure in said reaction chamber; heating said deposition surface to an elevated temperture; coupling said input end of said injector tube to a source of at least one reactant; coupling said exhaust end of said injector tube to a vacuum pump and pumping said reactant through said injector tube to cause injection of said reactant through said plurality of injection holes; controlling the amount of said reactant exhausted through said exhaust end; and reacting said reactant to deposit a film on said deposition surface.

21. The process of claim 20 wherein said reactant is a high molecular weight reactant.

22. The process of claim 21 wherein said high molecular weight reactant comprises a reactant having a molecular weight greater than 100.

23. The process of claim 21 wherein said film comprises a refractory metallic film and said high molecular weight reactant comprises a metal halide.

24. The process of claim 20 further comprising the step of injecting a second reactant through a second injection tube coupled through said first end cap.

25. The process of claim 20 further comprising the step of injecting a second reactant through a second injection tube coupled through said second end cap.

* * * * *